United States Patent [19]
Tomioka

[11] Patent Number: 5,640,032
[45] Date of Patent: Jun. 17, 1997

[54] NON-VOLATILE SEMICONDUCTOR MEMORY DEVICE WITH IMPROVED REWRITE SPEED

[75] Inventor: Yugo Tomioka, Tokyo, Japan

[73] Assignee: Nippon Steel Corporation, Tokyo, Japan

[21] Appl. No.: 525,264

[22] Filed: Sep. 7, 1995

[30] Foreign Application Priority Data

Sep. 9, 1994  [JP]  Japan .................... 6-242098

[51] Int. Cl.⁶ .................... H01L 29/68
[52] U.S. Cl. .......... 257/316; 257/321; 257/324; 257/314
[58] Field of Search .................... 257/316, 321, 257/324, 315, 322, 314

[56] References Cited

U.S. PATENT DOCUMENTS

| | | | |
|---|---|---|---|
| 5,150,179 | 9/1992 | Gill | 257/316 |
| 5,202,579 | 4/1993 | Fujii et al. | 257/751 |
| 5,245,212 | 9/1993 | Gill | 257/316 |
| 5,268,585 | 12/1993 | Yamauchi | 257/316 |
| 5,278,448 | 1/1994 | Fujii | 257/751 |
| 5,284,786 | 2/1994 | Sethi | 437/43 |
| 5,378,910 | 1/1995 | Yoshikawa | 257/314 |
| 5,475,251 | 12/1995 | Kuo et al. | 257/324 |
| 5,498,890 | 3/1996 | Kim et al. | 257/324 |
| 5,502,334 | 3/1996 | Shinohara | 257/751 |

FOREIGN PATENT DOCUMENTS

| | | | |
|---|---|---|---|
| 0535694 | 4/1993 | European Pat. Off. | 257/321 |
| 0011621 | 10/1990 | WIPO | 257/321 |

*Primary Examiner*—Sara W. Crane
*Assistant Examiner*—David B. Hardy
*Attorney, Agent, or Firm*—Law Offices Pollock, Vande Sande & Priddy

[57] ABSTRACT

A non-volatile semiconductor memory device comprises a semiconductor substrate, a shield gate electrode formed over a device isolation region of the semiconductor substrate through a shield gate insulating film, a floating gate electrode formed over a device region of the semiconductor substrate through a tunnel insulating film, the device region lying adjacent to the device isolation region and a part of the floating gate electrode overlapping the device isolation region so as to form a gap region therebetween, and a control gate electrode formed over the floating gate electrode through an oxide/nitride/oxide (ONO) film and formed over the shield gate electrode through a shield cap insulating film such that a part of the control gate electrode extends into the gap region.

26 Claims, 9 Drawing Sheets

NON-VOLATILE SEMICONDUCTOR MEMORY DEVICE WITH IMPROVED REWRITE SPEED

FIELD OF THE INVENTION

This invention relates to a non-volatile semiconductor memory device capable of electrically writing and erasing data, and to a fabrication method thereof. The present invention is suitable for application to non-volatile semiconductor memory devices having stacked gate type memory cells.

BACKGROUND OF THE INVENTION

EEPROMs (Electrically Erasable Programmable Read-Only Memories) and flash memories are known as non-volatile semiconductor memory devices capable of electrically writing and erasing data.

Since a memory cell can be constituted by one memory cell in a flash memory having a stacked gate type memory cell structure, the steps of manufacturing the memory can be simplified, the unit price per bit reduced and a high integration density, as well as a large capacity be attained. For these reasons, the flash memory has gained a wide application mainly as a substitute for magnetic recording media such as hard disks and floppy disks.

A selective oxidation process such as a LOCOS (local oxidation of silicon) process is known as a device isolation method conventionally used for semiconductor devices such as non-volatile semiconductor memory devices. The LOCOS process has the advantages that the fabrication method is simple, and the occurrence of defects can be relatively easily controlled because inclination at the boundary between device isolation regions and device regions is not abrupt.

However, as the devices have been miniaturized to meet requirements for higher integration density, the following problems arise. From the standpoint of device processing, there occur the problems of device isolation pitch and the thickness of the device isolation oxide film in connection with the occurrence of bird's beaks. With respect to electrical characteristics, there arise the problems of field inversion, narrow channel effect, and punch-through in connection with diffusion of an impurity in a transverse direction.

A conventional non-volatile semiconductor memory device in which device isolation is effected by using the LOCOS process is explained with reference to FIG. 9. This figure is a sectional view of a conventional stacked gate type EEPROM memory cell in a direction of a word line (control gate) in which device isolation is effected by the LOCOS process.

In FIG. 9, a device isolation oxide film 302 is formed on a silicon substrate 301 by the LOCOS process, and a floating gate 304 comprising a polycrystalline silicon film is formed in a device region between the device isolation oxide films 302 through a tunnel oxide film 303, and a word line (control gate) 306 comprising a polycrystalline silicon film is formed over the floating gate 304 through an insulating film 305.

Because the structure effects device isolation by using the LOCOS process, the problems described above hinder miniaturization and higher integration density. In the case of the EEPROM and the flash memory, in particular, a high voltage of at least 5 V is applied to the word line 306 at the time of write and erase and consequently, a parasitic channel is likely to be formed below the device isolation oxide film 302. Therefore, specific counter-measures must be taken.

A trench device isolation method shown in FIG. 10 has been therefore proposed. FIG. 10 is a sectional view of a stacked gate EEPROM memory cell according to the trench device isolation method in the direction of the word line.

Referring to FIG. 10, a floating gate 405 comprising a polycrystalline silicon layer is shown formed over a silicon substrate 401 through a tunnel oxide film layer 404, and a control gate 407 comprising a polycrystalline silicon layer is formed over the floating gate 405 through an insulating layer 406. The silicon substrate 401, the floating gate 405 and the control gate 407 are isolated for each memory cell by a trench 409. The trench 409 is buried by a boron phosphorus silicate glass (BPSG) film 402 through a trench insulating film 403, and the control gate 407 is connected to the word line 408 made of tungsten silicide.

In this structure, the device regions are isolated by the trenches 409 and at the same time, the floating gate 405 as well as the control gate 407 are isolated for each memory cell. Therefore, this structure provides a very small cell area.

With to the trench isolation method shown in FIG. 10, however, there remains the problem that, because the trenches must be formed in the substrate, the fabrication process is complicated, and that control of defects occurring at the time of forming the trenches is also difficult.

SUMMARY OF THE INVENTION

It is an object of the present invention to provide a non-volatile semiconductor memory device free of the problems described above, and a fabrication method thereof.

Further, when the main application of the flash memories to portable electronic appliances, etc, is taken into consideration, it is also very important to reduce power source voltage and to improve the write operation speed. When the operation of a single memory cell is considered, therefore, a voltage applied, in practice, to the tunnel oxide film affects efficiency of hot electron injection and FN (Fowler-Nordheim) tunnelling and becomes an important factor in reducing the power source voltage.

In other words, the voltage applied to the control gate electrode is not, as such, applied to the tunnel oxide film but the voltage $V_{PROG}$ practically applied to the tunnel oxide film during the write operation, for example, is lower than the voltage applied to the control gate electrode as expressed by the following equation:

$$V_{PROG} = K_{PROG} \times V_{CG} \quad (1)$$

$$K_{PROG} = C_{FC}/(C_{FC} + C_{FCH} + C_{FD} + C_{FS}) \quad (2)$$

where $K_{PROG}$: capacitance coupling ratio in write operation $V_{CG}$: voltage applied to control gate electrode $C_{FC}$: capacitance between control gate electrode and floating gate electrode $C_{FCH}$: capacitance between floating gate electrode and channel region $C_{FD}$: capacitance between floating gate electrode and drain diffusion layer $C_{FS}$: capacitance between floating gate electrode and source diffusion layer Therefore, in order to improve efficiency of hot electron injection and FN tunnelling in the write operation, for example, the memory cell structure must be optimized to increase the coupling ratio.

As can be clearly understood from the equation (2), it is effective to increase the area of an overlap region between the control gate electrode and the floating gate electrode so as to increase the coupling ratio, to lower the voltage supplied to the control gate electrode, and to improve a rewrite speed.

It is therefore another object of the present invention to provide a non-volatile semiconductor memory device capable of lowering the write voltage and of improving an integration density and a fabrication method thereof.

According to the first aspect of the present invention for solving the problems described above, there is provided a non-volatile semiconductor memory device which comprises a shield gate electrode formed in a device isolation region of a semiconductor substrate through a shield gate insulating film; a floating gate electrode, a part of a region of the floating gate electrode coming into contact with a device region isolated by the device isolation region through a tunnel insulating film; and a control gate electrode formed over the floating gate electrode through an inter-layer insulating film, at least a part of region thereof coming into contact with the lower surface of the floating gate electrode through an insulating film.

According to the second aspect of the present invention, there is provided a non-volatile semiconductor memory device which comprises device isolation regions including shield gate electrodes disposed and formed over a semiconductor substrate of a first conductivity type through a shield gate insulating film and with a predetermined distance between them, sidewall insulating films formed on the side surfaces of the shield gate electrodes, and cap insulating films formed on the upper surface of the shield gate electrodes; floating gate electrodes formed in such a manner as to overlap the device isolation regions through an inter-layer insulating film, a part of the region thereof coming into contact with a device region between the device isolation regions through a tunnel insulating film; and control gate electrodes formed in a direction orthogonally crossing the device isolation regions over the floating gate electrodes through the inter-layer insulating film, at least a part of region thereof coming into contact with the lower surface of respective one of the floating gate electrodes through the inter-layer insulating film.

In the non-volatile semiconductor memory device according to the present invention, a predetermined voltage is applied to the shield gate electrodes formed through the shield gate insulating film so as to effect device isolation, and a part of the control gate electrode comes into contact with the lower surface of the floating gate electrode through the insulating film. Therefore, the write voltage can be lowered and a higher integration density can be accomplished.

A method of making a non-volatile semiconductor memory device according to the first aspect of the present invention comprises the steps of: (a) sequentially forming a first insulating film, a first conductor film, a second insulating film and a third insulating film on a semiconductor substrate of a first conductivity type; a step of (b) separating the first insulating film, the first conductor film, the second insulating film and the third insulating film in a predetermined direction with a predetermined distance to form device isolation regions; a step of (c) forming sidewall insulating films on the side surfaces of the first insulating film, the first conductor film, the second insulating film and the third insulating film; a step of (d) forming a tunnel insulating film in device regions between the device isolation regions; a step of (e) forming a second conductor film on the entire surface and removing a part of the second conductor film on the device isolation regions; a step of (f) removing at least a part of the third insulating film, a step of (g) forming an inter-layer insulating film so as to cover the entire exposed surface of the second conductor film; a step of (h) forming a third conductor film on the entire surface by a CVD (chemical vapor deposition) process; a step of (i) isolating the third conductor film, the inter-layer insulating film and the second conductor film in a direction orthogonally crossing the device isolation regions with a predetermined distance; and a step of (j) ion-implanting an impurity of a second conductivity type by using the third conductor film as a mask so as to form source/drain diffusion layers.

A method of making a non-volatile semiconductor memory device according to the second aspect of the present invention comprises the step of: (a) sequentially forming a first insulating film, a first conductor film, a second insulating film and a third insulating film on a semiconductor substrate of a first conductivity type; a step of (b) isolating the first insulating film, the first conductor film, the second insulating film and the third insulating film in a predetermined direction with a predetermined distance so as to form device isolation regions; a step of (c) forming source/drain diffusion layers on both sides of the device isolation regions by slant ion implantation from a direction orthogonally crossing the device isolation region and forming channel regions between the source/drain diffusion layers; a step of (d) forming sidewall insulating films on the side surfaces of the first insulating film, the first conductor film, the second insulating film and the third insulating film; a step of (e) forming a tunnel insulating film in device regions between the device isolation regions; a step of (f) forming a second conductor film on the entire surface and then removing a part of the second conductor film in the device isolation regions; a step of (g) removing at least a part of the third insulating film; a step of (h) forming an inter-layer insulating film so as to cover the entire exposed surface of the second conductor film; a step of (i) forming a third conductor film on the entire surface by a CVD process; and a step of (j) isolating the third conductor film, the inter-layer insulating film and the second conductor film in a direction orthogonally crossing the device isolation regions with a predetermined distance.

According to the present invention method of making a non-volatile semiconductor memory device, the third insulating film is formed over the first conductor film through the second insulating film, the third insulating film covered with the second conductor film is partially removed through openings formed in the second conductor film, and then the third conductor film is formed on the entire surface by the CVD process through the inter-layer insulating film. In this way, a part of the third conductor film is formed on the lower surface of the second conductor film, and the overlapping area between the third conductor film and the second conductor film can be increased with hardly any increase in the process steps.

DESCRIPTION OF THE PREFERRED EMBODIMENTS

Figure 1:
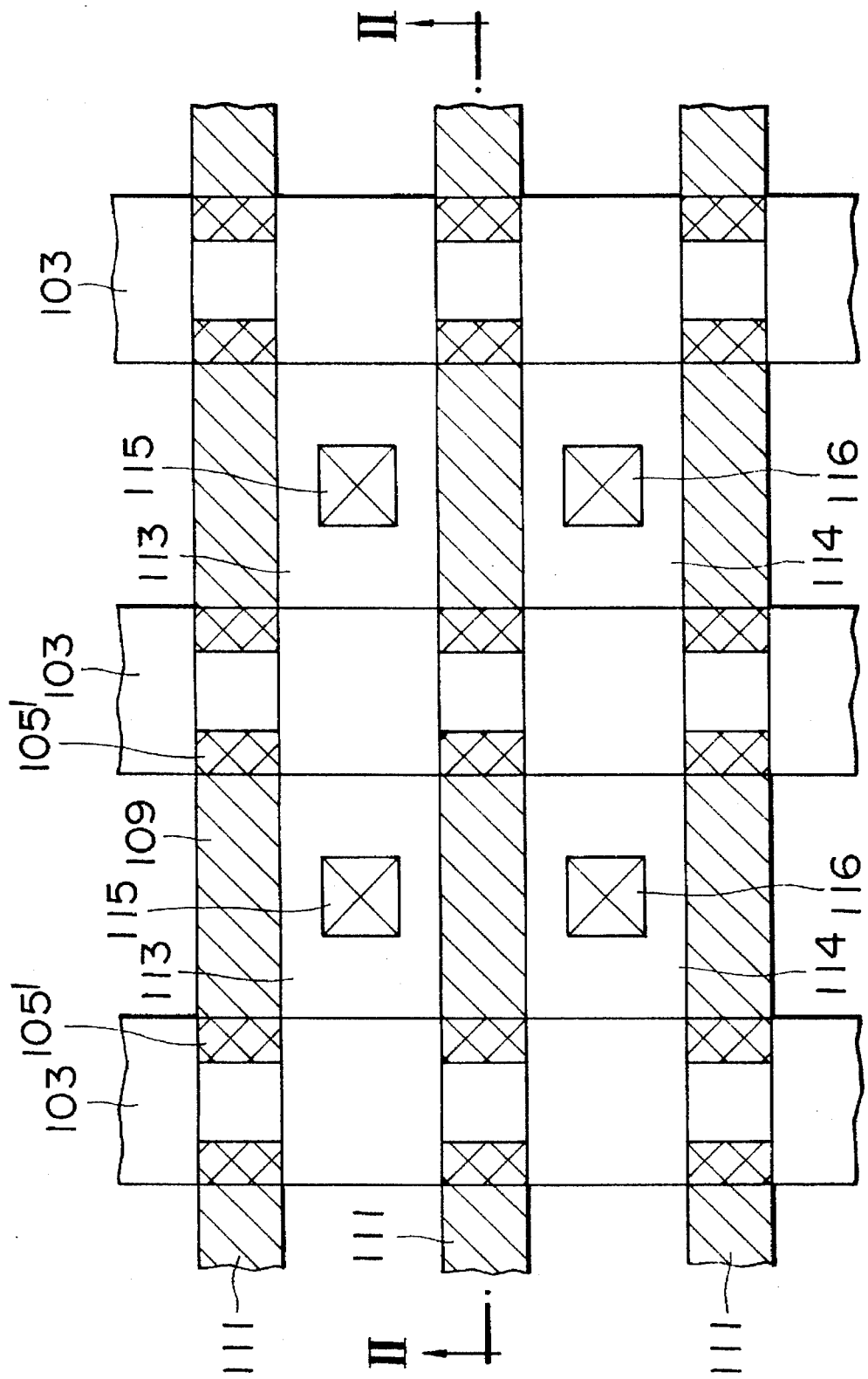
FIG. 1 is a plan view showing a pattern of memory cells of a non-volatile semiconductor memory device according to a first embodiment of the present invention.

Hereinafter, a non-volatile semiconductor memory device according to a first embodiment of the present invention will be explained with reference to FIGS. 1 and 2. FIG. 1 is a plan view showing a pattern of memory cells according to the first embodiment of the present invention and FIG. 2 is a sectional view taken along the line II—II of FIG. 1.

Figure 2:
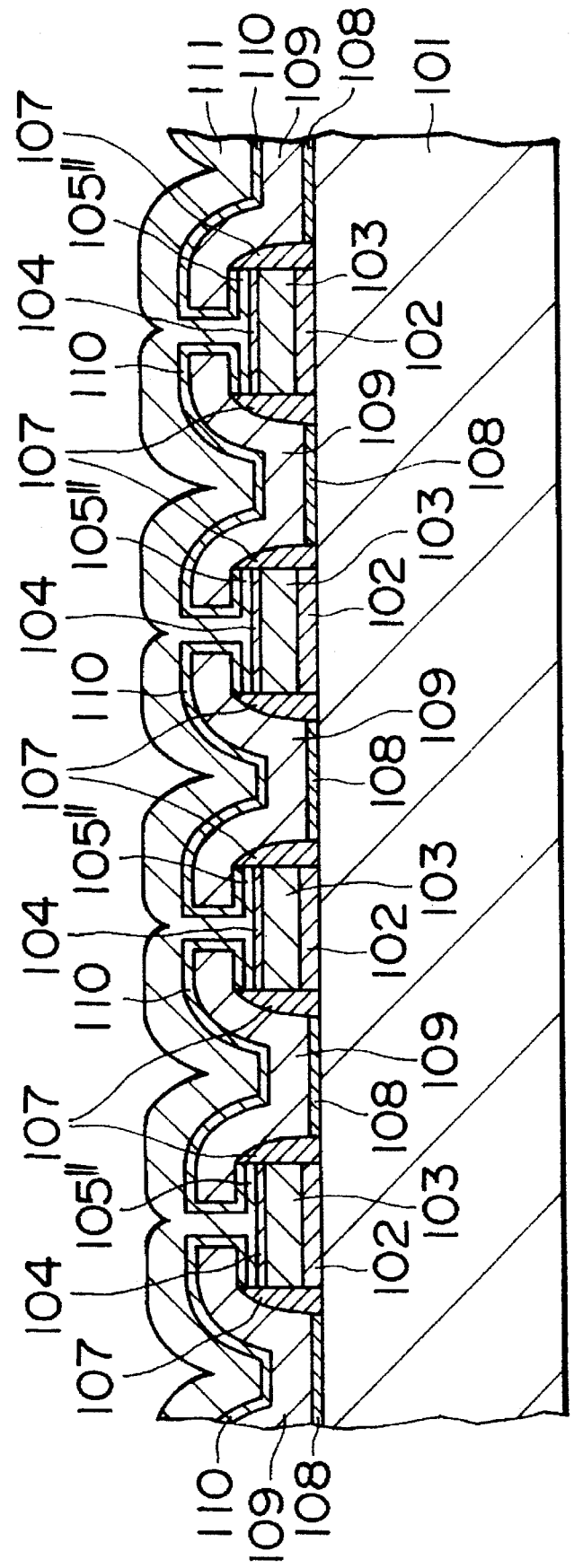
FIG. 2 is a sectional view showing the structure of the memory cell of the non-volatile semiconductor memory device according to the first embodiment of the present invention.

Referring initially to FIG. 2, a shield gate electrode 103 for device isolation is shown formed over a P type silicon substrate through a shield gate insulating film 102. When a predetermined voltage is applied to the shield gate electrodes 103, device regions formed between these shield gate electrodes 103 are electrically isolated from one another. A sidewall oxide film 107 is formed on the side surface of each shield gate electrode 103, and a shield cap oxide film 104 is formed on the upper surface of each shield gate electrode 103.

A silicon dioxide film having a film thickness of from about 50 to about 130 Å is formed by thermal oxidation in a channel region isolated by the shield gate electrode 103 so as to serve as a tunnel oxide film 108, and an electrically conductive, polycrystalline silicon film is formed as a floating gate electrode 109 in such a manner as to bridge between the shield gate electrodes 103 and to define gap regions 105".

For example, an ONO film which comprises a silicon dioxide film/a silicon nitride film/a silicon dioxide film and has a film thickness of about 150 to about 200 Å calculated as the oxide film thickness and which is to serve as an inter-layer insulating film 110, is formed on the upper and side surfaces of the floating gate electrode 109 and on the lower surface of the floating gate electrode 109 bridging over the shield gate electrode 103. Then an electrically conductive polycrystalline silicon film is formed as a control gate electrode 111 around the outer peripheral portion of the inter-layer insulating film 110 in such a manner as to bury each gap region 105".

N type drain and source diffusion layers 113 and 114 are formed on both sides of each floating gate electrode 109 in a direction orthogonally crossing line II—II in FIG. 1, and these drain and source diffusion layers 113 and 114 are commonly shared by two floating gate electrodes 109. Arsenic is introduced as an impurity into the drain diffusion layer 113 and into the source diffusion layer 114 at a surface concentration of about $1\times10^{18}$ to about $1\times10^{21}$ cm$^{-3}$. The drain diffusion layer 113 is electrically connected to a metal wiring layer, not shown, through each drain contact 115, and the source diffusion layer 114 is likewise connected electrically to the metal wiring layer, not shown, through each source contact 116.

Figure 3:
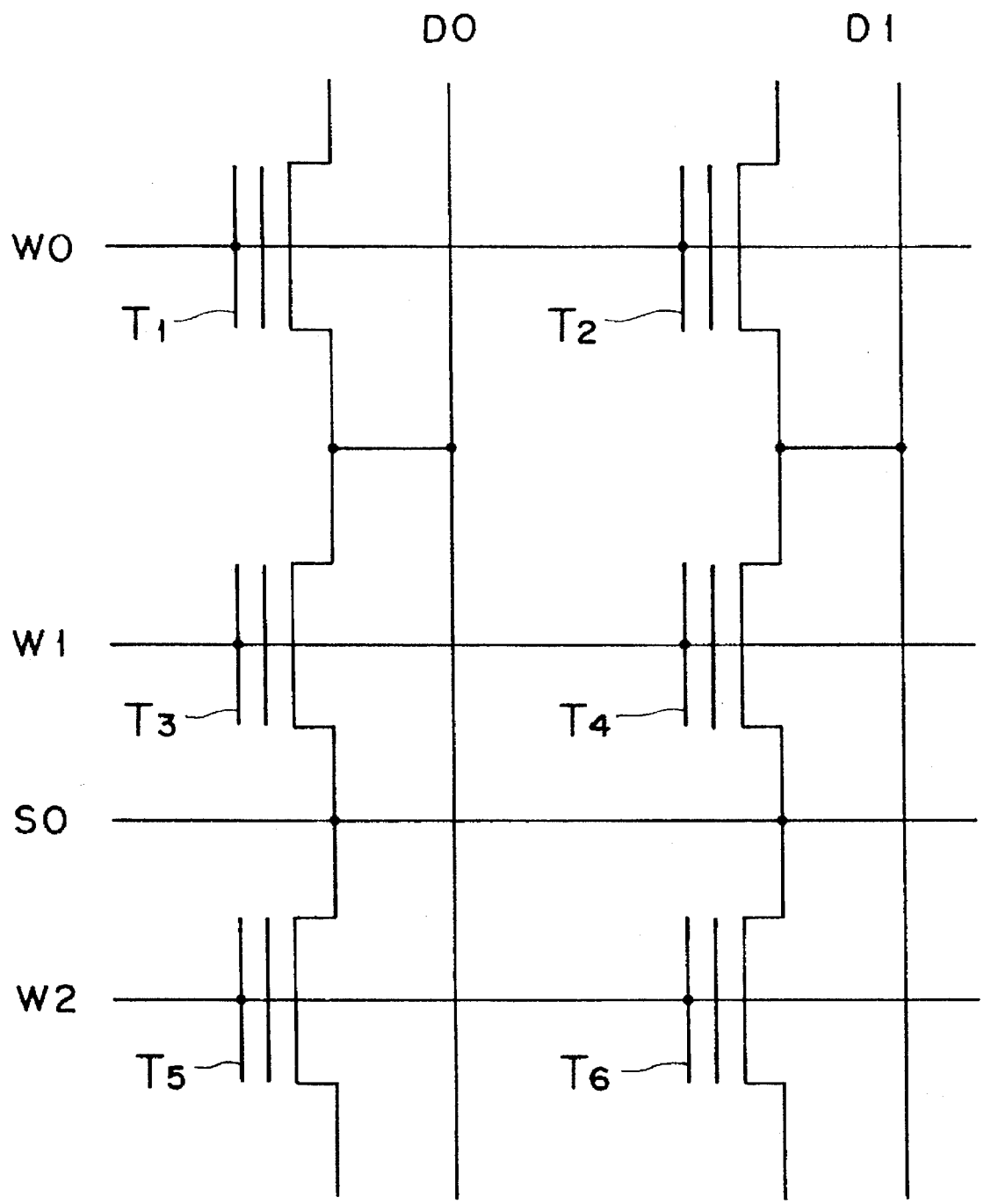
FIG. 3 is a circuit diagram showing equivalently the non-volatile semiconductor memory device according to the first embodiment of the present invention.

Next, the operation of the non-volatile semiconductor memory device according to the first embodiment of the present invention will be explained with reference to FIG. 3. This drawing is a circuit diagram showing equivalently the non-volatile semiconductor memory device according to the first embodiment of the present invention.

When a memory cell transistor T3, for example, is selected at the time of write, a voltage 6 V is applied to a bit line D0, 0 V to a bit line D1, 0 V to a source line S0, 10 V to a word line W1 and 0 V to word lines W0 and W2, for example, by a decoder not shown in the drawing, thereby giving 6 V to the drain diffusion layer 113, 0 V to the source diffusion layer 114 and 10 V to the control gate electrode 111 of the memory cell transistor T3.

Accordingly, a current flows through the channel region of the memory cell transistor T3, and the electrons which are accelerated by an electric field in a pinch-off region formed in the channel region in the vicinity of the drain diffusion layer 113 change to hot electrons and are injected into the floating gate electrode 109 beyond the energy barrier of the tunnel oxide film 108. Because the electrons so injected are held in the floating gate electrode 109 which is under the electrically floating state, the threshold voltage of the memory cell transistor T3 rises from about 2 V at the initial stage to about 7 V, and write operation is effected.

At the time of erase operation, on the other hand, the bit lines D0, D1 are released by the decoder, not shown, 12 V is applied to the source line S0 and 0 V is applied to the word lines W0 to W2, so that the drain diffusion layer 113 is brought into the floating state, and voltages of 12 V and 0 V are applied to the source diffusion layer 114 and the control gate electrode 111, respectively.

Consequently, the electrons in the floating gate electrode 109 are extracted into the source diffusion layer 114 through the tunnel oxide film 108 due to FN tunnelling and the threshold voltages of the memory cell transistors T3 to T6 are lowered from about 7 V to about 2 V, for example, thereby effecting sector erase.

When the memory cell transistor T3, for example, is selected at the time of read operation, 1 V is applied to the bit line D0, 0 V to the bit line D1, 0 V to the source line S0, 5 V to the word line W1 and 0 V to the word lines W0 and W2, for example, by the decoder not shown in the drawing. In consequence, 1 V is applied to the drain diffusion layer 113 of the memory cell transistor T3, 0 V to the source diffusion layer 114 and 5 V to the control gate electrode 111, and a sense amplifier, not shown, detects whether the current flows through the memory cell transistor T3.

According to this first embodiment, the voltage to be applied to the control gate electrode 111 at the time of write operation can be decreased from the conventional voltage value of about 12 V to about 10 V and the voltage during the operation can be lowered.

As described above, in the non-volatile semiconductor memory device according to the first embodiment of the present invention, the shield gate electrode 103 is formed in the device isolation region through the shield gate insulating film 102, and the device regions defined between the shield gate electrodes 103 are electrically isolated from one another by applying a predetermined voltage to the shield gate electrodes 103. Therefore, the dimensional shift in the device regions can be much more restricted in comparison with the LOCOS process, and the memory cell area can be reduced. Further, because a channel stop impurity layer need not be formed in the device isolation regions, the narrow channel effect between the devices can be restricted. Because the shield gate electrode 103 is kept fixed at the reference potential, the occurrence of a parasitic channel can be prevented even when a high voltage is applied to the word lines. Because the control voltage is applied from both upper and lower surfaces of the floating gate electrode 109, a capacitance coupling ratio between the floating gate electrode 109 and the control gate electrode 111 can be improved without increasing the cell size, and write operation can be made at a low voltage.

Next, a fabrication method of the non-volatile semiconductor memory device according to the first embodiment of the present invention will be explained with reference to FIGS. 4A to 4E.

Figure 4A:
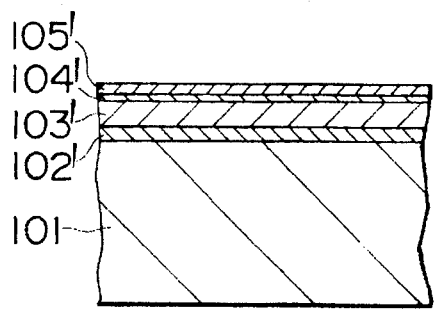
FIGS. 4A to 4E are schematic sectional views, each showing step-wise a fabrication process of a non-volatile semiconductor memory device according to the first embodiment of the present invention.

First, as shown in FIG. 4A, a silicon dioxide film 102' having a thickness of about 50 to about 100 nm is formed on a P type silicon substrate 101 by thermal oxidation or CVD process. A polycrystalline silicon film 103" which is doped into a P or N type and has a thickness of about 100 to about 300 nm, a silicon dioxide film 104' having a thickness of about 100 to about 300 nm and a silicon nitride film 105' having a thickness of about 100 to about 200 nm are then formed sequentially by the CVD process.

Figure 4D:
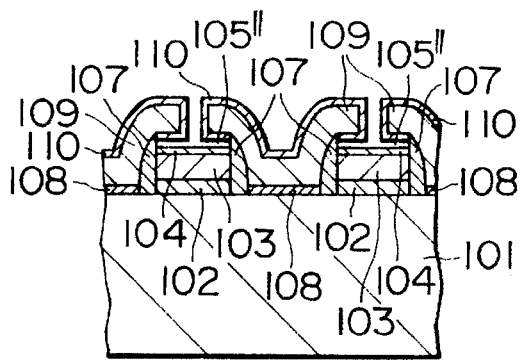
Figure 4B:
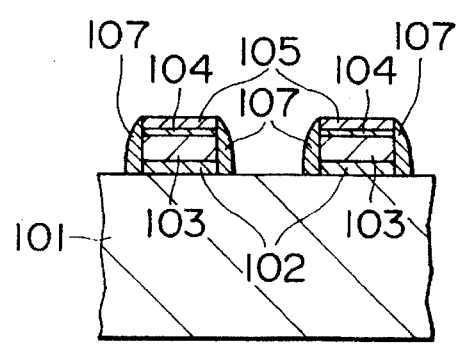

Next, as shown in FIG. 4B, the silicon dioxide film 102', the polycrystalline silicon film 103', the silicon dioxide film 104' and the silicon nitride film 105' are patterned by photolithography and dry etching, and a shield gate insulating film 102, a shield gate electrode 103, a shield cap oxide film 104 and a shield cap nitride film 105 are formed in the device isolation region. Thereafter, a silicon dioxide film having a thickness of about 100 to about 300 nm is deposited on the entire surface, and side-wall oxide films 107 are formed on the side walls of the shield gate electrode 103 by anisotropic dry etching.

Figure 4E:
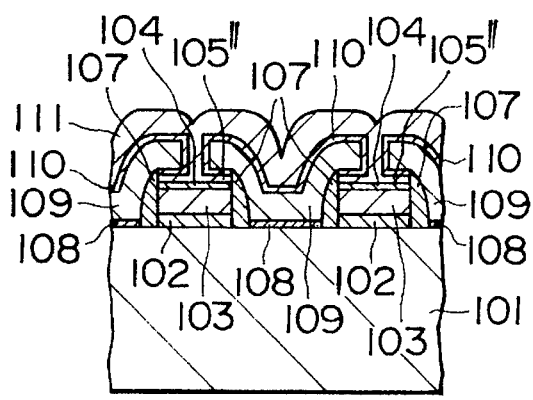
Figure 4C:
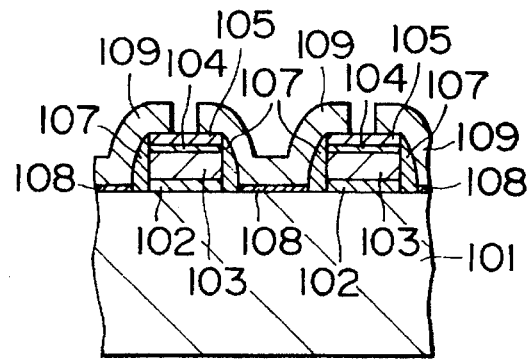

After the surface of the P type silicon substrate 101 in the device region is exposed by wet etching, a silicon dioxide film having a thickness of about 10 nm is formed as a tunnel oxide film 108 by thermal oxidation as shown in FIG. 4C. Incidentally, an oxide nitride film obtained by nitriding an oxide film by quick heat-treatment may be used as the tunnel oxide film 108. Thereafter, an electrically conductive polycrystalline silicon film having a thickness of about 100 to about 300 nm is formed by the CVD process, and the polycrystalline silicon film is isolated in the direction of line II—II in FIG. 1 on the shield gate electrode 103 by photolithography and dry etching, forming thereby a floating gate electrode 109.

Next, as shown in FIG. 4D, at least a part of the shield cap nitride film 105 is removed by wet etching using hot phosphoric acid, and a gap region 105" is defined between the floating gate electrode 109 and the shield cap oxide film 104. Thereafter, for example, an ONO (oxide/nitride/oxide) insulating film comprising a silicon dioxide film/a silicon nitride film/a silicon dioxide film and having a film thickness of about 15 to about 20 nm calculated as the oxide film is formed as an inter-layer insulating film 110 on the upper and side surfaces of the floating gate electrode 109 and on the lower surface of the floating gate electrode 109 in the gap region 105". Incidentally, the silicon dioxide film as the lower layer of the ONO insulating film is formed into a film thickness of about 10 nm by the CVD process or by the thermal oxidation process at 900° to 1,000° C., and the silicon nitride film is formed into a film thickness of about 10 nm by the CVD process. Further, the silicon dioxide film as the upper layer of the ONO insulating film is formed into a film thickness of about 5 nm by the CVD process or by the thermal oxidation process at 900° to 1,000° C.

After an electrically conductive polycrystalline silicon film is formed by the CVD process, or the like, in such a manner as to cover the surface of the inter-layer insulating film 110, the polycrystalline silicon film is separated in a direction orthogonally crossing the direction II—II in FIG. 1 by photolithography and dry etching so as to form the control gate electrode 111 as shown in FIG. 4E. At this time, the floating gate electrode 109 and the inter-layer insulating film 110 are simultaneously etched and are isolated in the direction orthogonally crossing the direction II—II in FIG. 1. Incidentally, the control gate electrode 111 may have a polyside or silicide structure so as to reduce the sheet resistance.

Next, an impurity ion such as arsenic is implanted in a dose of $5 \times 10^{15}$ cm$^{-2}$ at implantation energy of 50 to 90 keV by using the control gate electrode 111 as a mask. There are thus formed the N type drain diffusion layer 113 and source diffusion layer 114 shown in FIG. 1. A silicon dioxide film containing phosphorus and boron, that is, a BPSG film is formed as an inter-layer insulating film by the CVD process. After drain contacts 115 and source contacts 116 are opened, a metal wiring layer such as Al-Si-Cu is formed by sputtering.

As described above, the control gate electrode 111 can be formed on the upper surface of the floating gate electrode 109 and a part of its lower surface and the device isolation regions devoid of the occurrence of the dimensional shift can be formed by the simple method.

Figure 5:
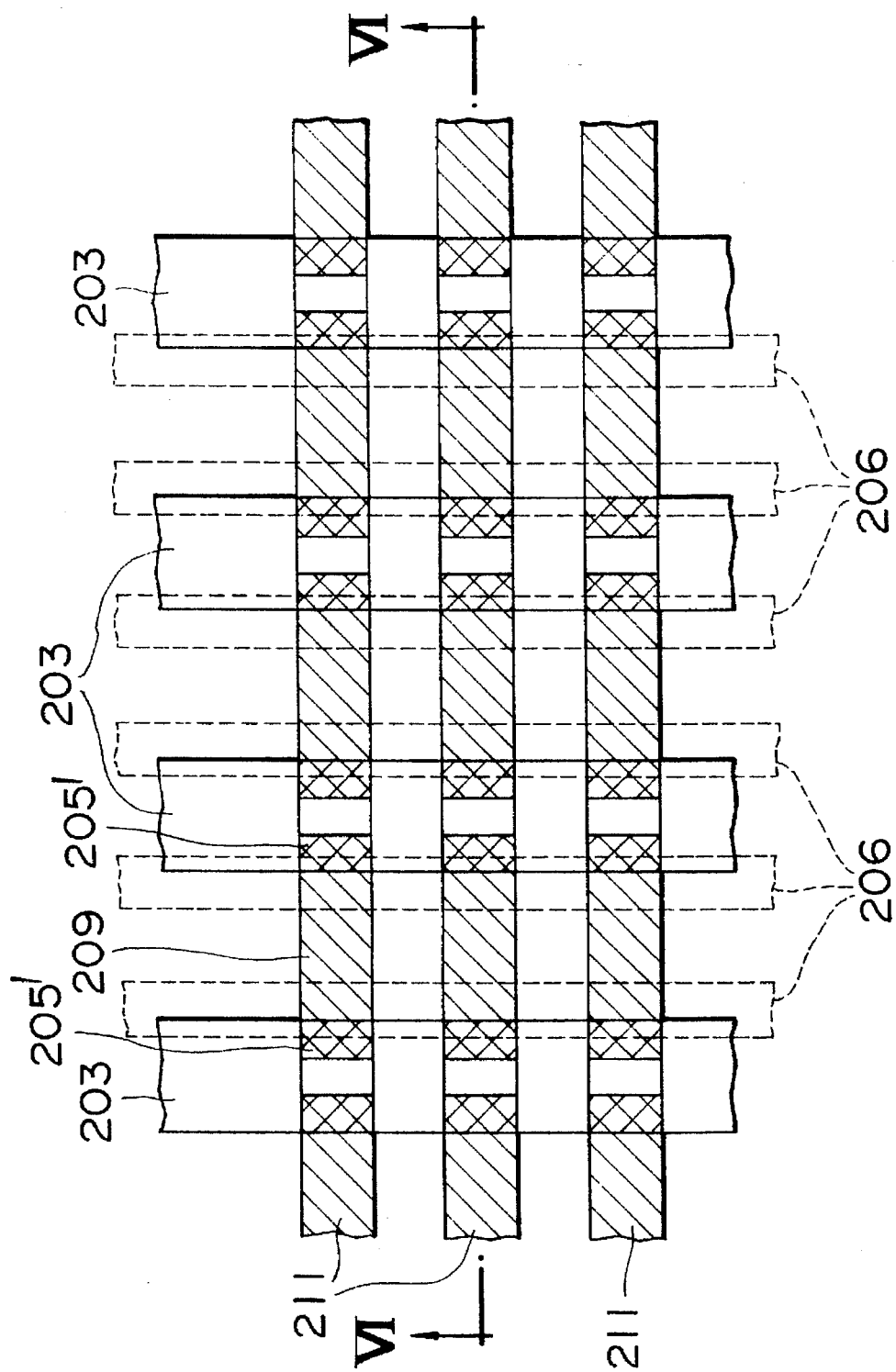
FIG. 5 is a plan view showing a pattern of memory cells of a non-volatile semiconductor memory device according to a second embodiment of the present invention.

Next, a non-volatile semiconductor memory device according to the second embodiment of the present invention will be explained with reference to FIGS. 5 and 6. FIG. 5 is a plan view showing the pattern of memory cells according to the second embodiment of the present invention, and FIG. 6 is a sectional view taken along the line VI—VI of FIG. 5.

Figure 6:
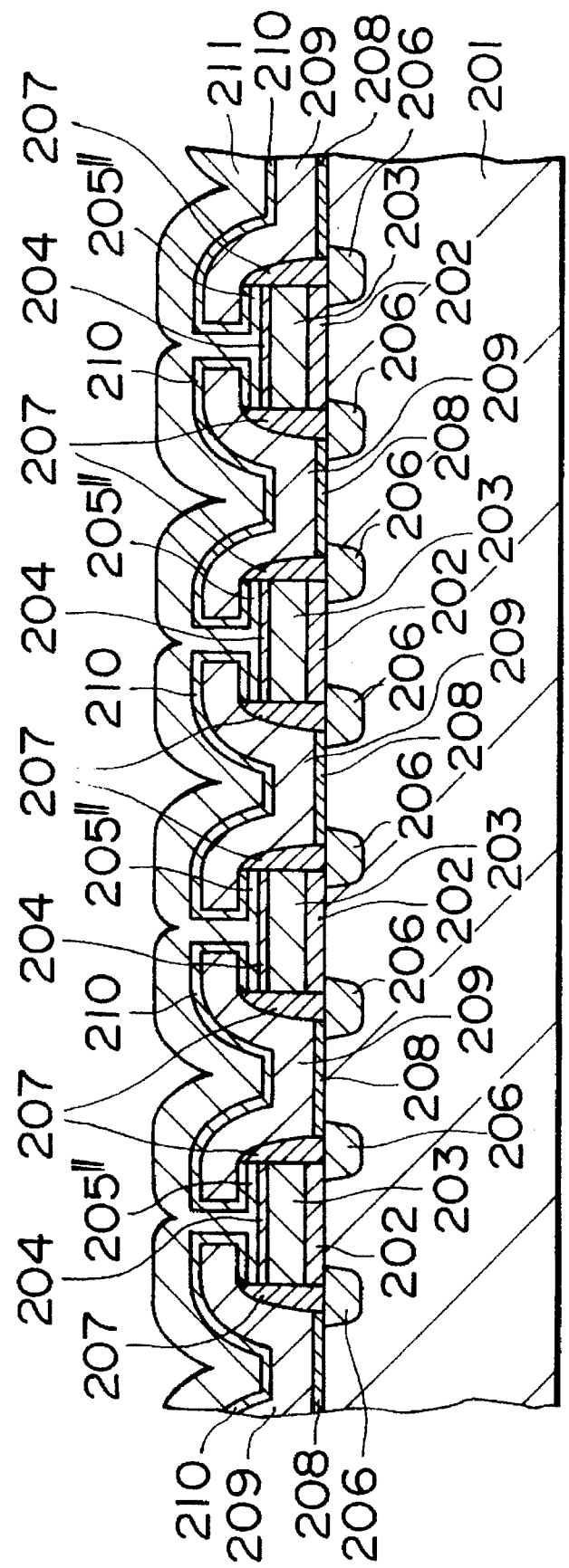
FIG. 6 is a sectional view showing the structure of the memory cell of the non-volatile semiconductor memory device according to the second embodiment of the present invention.

In FIG. 6, shield gate electrodes 203 for device isolation are shown formed over a P type silicon substrate 201 through shield gate insulating film 202, and when a predetermined voltage is applied to the shield gate electrodes 203, device regions defined between the shield gate electrodes 203 are electrically isolated from one another. A sidewall nitride film 207 is formed on the side surface of each shield gate electrode 203 and a shield cap oxide film 204 is formed on the upper surface of the shield gate electrode 203. A buried diffusion layer 206 which serves as a source/drain is formed in a P type silicon substrate 201 under the shield gate electrode 203. This buried diffusion layer 206 is so formed as to overlap a part of the region of the floating gate electrode 209, and arsenic as an impurity is implanted at a surface concentration of about $1 \times 10^{18}$ to about $1 \times 10^{21}$ cm$^{-3}$.

A silicon dioxide film having a thickness of about 5 to about 13 nm is formed as a tunnel oxide film 208 by thermal oxidation in the channel regions isolated by the shield gate electrodes 203, and an electrically conductive polycrystalline silicon film is formed as a floating gate electrode 209 on the tunnel oxide film 208 in such a manner as to bridge the shield gate electrodes 203 and to provide gap regions 205".

For example, an ONO film as an inter-layer insulating film 210, which comprises a silicon dioxide film/a silicon nitride film/a silicon dioxide film and has a film thickness of about 15 to 20 nm calculated as an oxide film, is formed on the upper and side surfaces of the floating gate electrode 209 and on the lower surface of the floating gate electrode 209 at the portion bridging the shield gate electrodes 203, and an electrically conductive polycrystalline silicon film as a control gate electrode 211 is formed around the outer peripheral portion of the inter-layer insulating film 210 so as to bury the gap regions 205".

As shown in FIG. 5, each buried diffusion layer 206 is formed in common to the memory cells disposed in the direction orthogonal to the word lines. One of the ends (drain) of the buried diffusion layer 206 is connected to a bit line through a bit contact disposed for each predetermined block and the other end (source) is likewise connected to a source line through a source contact disposed for each predetermined block. In other words, the one of the ends (drain) of the buried diffusion layer 206 inside the silicon substrate 201 constitutes the bit line and the other (source) the source line. This structure eliminates the necessity for the bit contact and the source contact in each memory cell, so that the area of each memory cell can be reduced.

Figure 7:
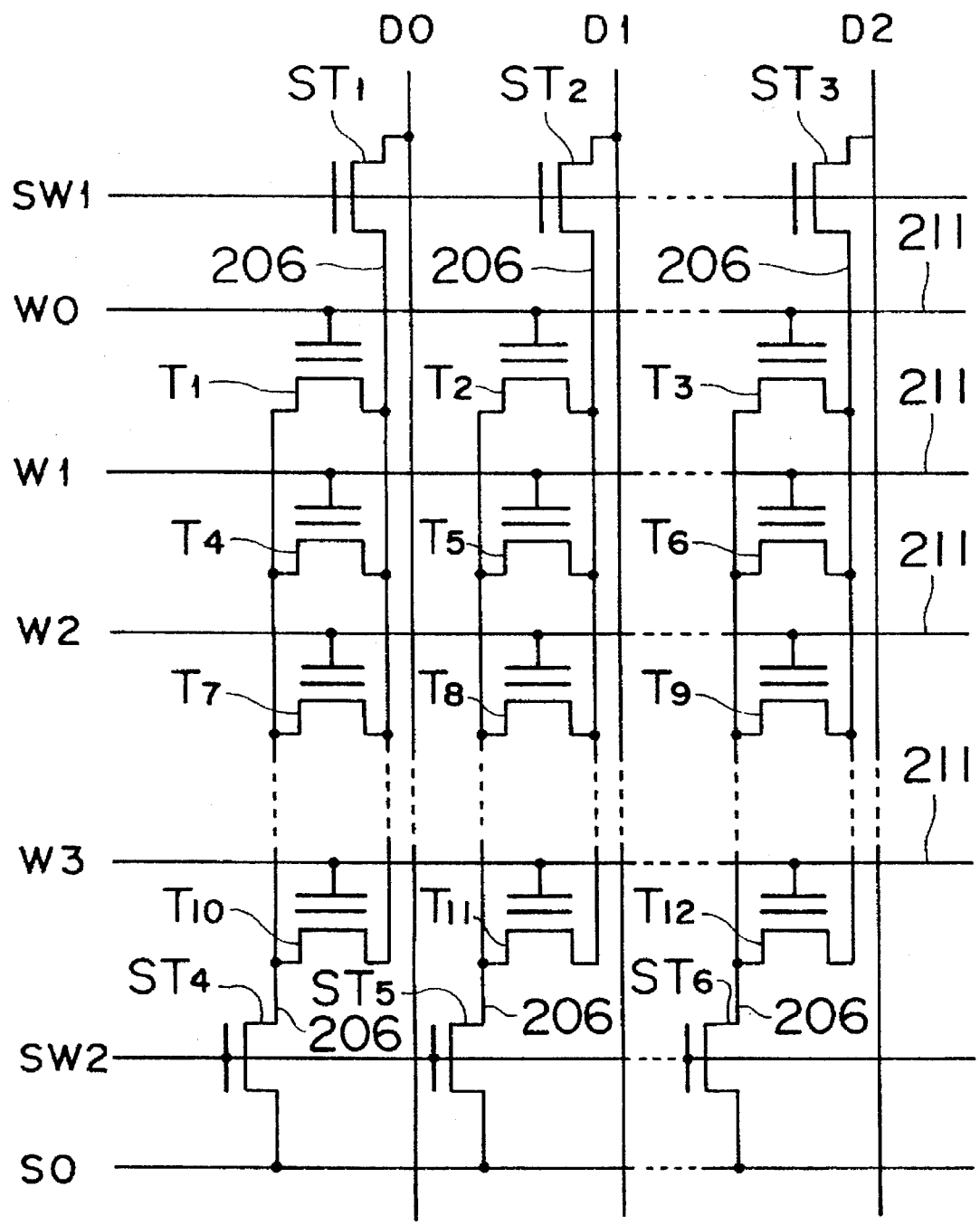
FIG. 7 is a circuit diagram showing equivalently the non-volatile semiconductor memory device according to the second embodiment of the present invention.

Next, the operation of the non-volatile semiconductor memory device according to the second embodiment of the present invention will be explained with reference to FIG. 7. This figure is a circuit diagram showing equivalently the non-volatile semiconductor memory device according to the second embodiment.

When the memory cell transistor T5, for example, is selected at the time of write operation, 3 V is applied to the bit line D1, 0 V to the bit lines D0 and D2, 0 V to the source line S0, −9 V to the word line W1, 0 V to the word lines W0, W2, W3, 0 V to the substrate 201, 3 V to the selected word line SW1 and 0 V to the selected word line SW2, by a decoder not shown in the drawing. Accordingly, the selected transistor ST2 is turned ON, the selected transistor ST5 is turned OFF and the source diffusion layer of the memory cell transistor T5 is brought under the floating state, so that 3 V is applied to the drain diffusion layer and −9 V is applied to the control gate electrode 211.

Consequently, the electrons in the floating gate electrode 209 are extracted to the drain diffusion layer by FN tunnelling and write to the memory cell transistor T5 is effected.

At the time of erase operation, on the other hand, 0 V is applied to the bit lines D0 to D2, 0 V to the source line S0, 13 V to the word line W1, 0 V to the word lines W0, W2, W3, 0 V to the substrate 201 and 3 V to the selected word lines SW1, SW2, by the decoder not shown, so as to turn ON the selected transistors ST2, ST5 and to apply 0 V to the drain diffusion layer and the source diffusion layer and 0 V to the control gate electrode 211.

In consequence, the electrons are injected into the memory cell transistors T4 to T6 connected to the word line W1 from the substrate 201 by FN tunnelling, and sector erase is carried out.

When the memory cell transistor T5 is selected at the time of read operation, for example, 1 V is applied to the bit line D1, 0 V to the bit lines D0, D2, 0 V to the source line S0, 3 V to the word line W1, 0 V to the word lines W0, W2, W3, 0 V to the substrate 201 and 3 V to the selected word lines SW1, SW2, by the decoder not shown in the drawing, so as to turn ON the selected transistors ST2, ST5 and to apply 1 V to the drain diffusion layer of the memory cell transistor T5, 0 V to the source diffusion layer and 3 V to the control gate electrode 211. A sense amplifier, not shown, detects whether the current flows through the memory cell transistor T5.

Because a capacitance coupling ratio between the control gate electrode 211 and the floating gate electrode 209 is improved in this second embodiment, the voltage applied to the control gate electrode 211 at the time of write operation can be decreased, and a lower voltage at the time of operation can be accomplished.

In the non-volatile semiconductor memory device according to the second embodiment described above, the shield gate electrodes 203 are formed in the device isolation regions through the shield gate insulating film 202, and the device regions defined between the shield gate electrodes 203 are electrically isolated from one another by applying a predetermined voltage to the shield gate electrode 203. Further, the source/drain are constituted by the buried diffusion layer 206 so as to eliminate the drain contacts and the source contacts. Therefore, the memory cell area can be made smaller than in the conventional devices. Further, the capacitance coupling ratio between the floating gate electrode 209 and the control gate electrode 211 can be improved by applying the control voltage from the upper and lower surfaces of the floating gate electrode 209 without increasing the cell size, and write at a lower voltage becomes possible.

The fabrication method according to the second embodiment of the present invention will be explained with reference to FIGS. 8A to 8E. These drawings are schematic sectional views, each showing step-wise the fabrication method according to the second embodiment of the present invention.

Figure 8A:
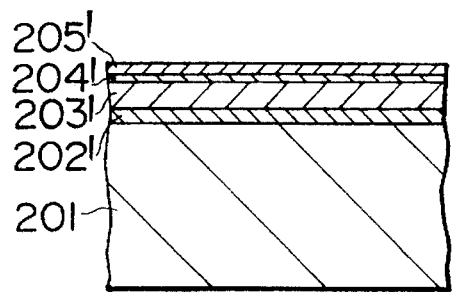
FIGS. 8A to 8E are schematic sectional views, each showing step-wise a fabrication process of the non-volatile semiconductor memory device according to the second embodiment of the present invention.

First, as shown in FIG. 8A, a silicon dioxide film 202' is formed into a thickness of about 50 to about 100 nm on a P type silicon substrate 201 by the thermal oxidation process or the CVD process. A polycrystalline silicon film 203' having a thickness of about 100 to 300 nm and doped into a P or N type, a silicon dioxide film 204' having a thickness of about 100 to about 300 nm and a silicon nitride film 205' having a thickness of about 100 to about 200 nm are sequentially formed by the CVD process.

Figure 8D:
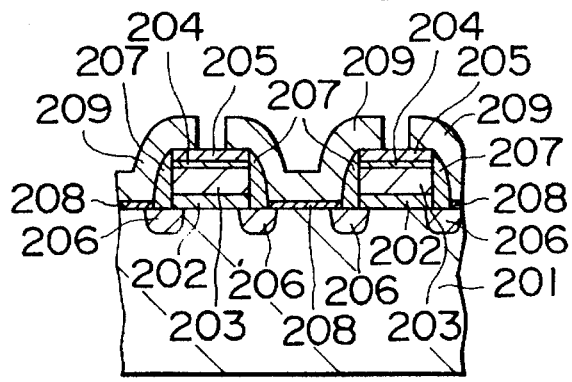
Figure 8B:
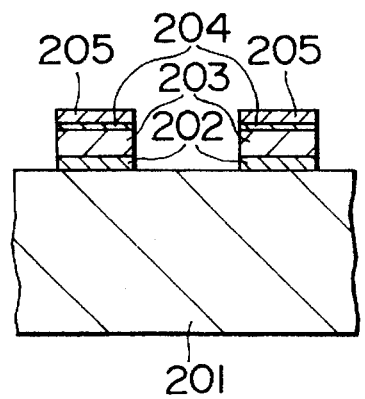

Next, the silicon dioxide film 202', the polycrystalline silicon film 203', the silicon dioxide film 204' and the silicon nitride film 205' are patterned by photolithography and anisotropic dry etching as shown in FIG. 8B so as to form a shield gate insulating film 202, a shield gate electrode 203, a shield cap oxide film 204 and a shield cap nitride film 205 in the device isolation region.

Figure 8E:
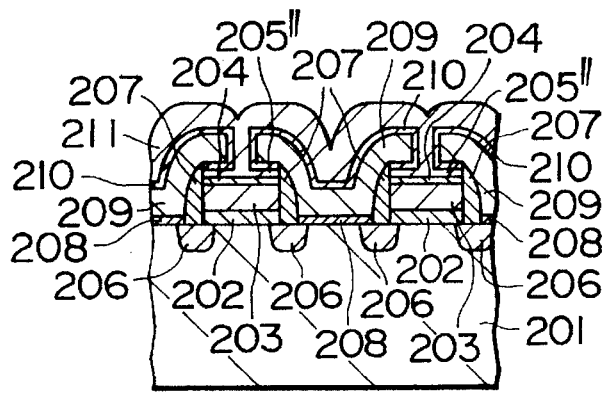
Figure 8C:
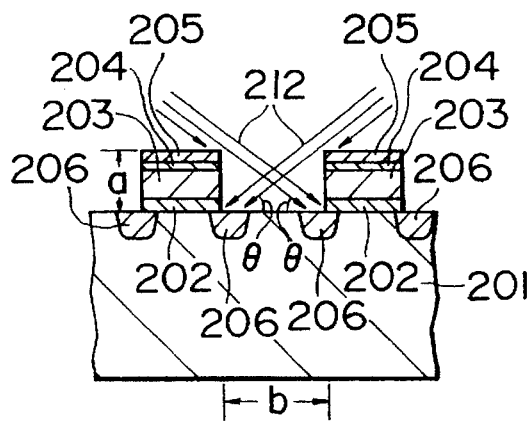
Figure 9:
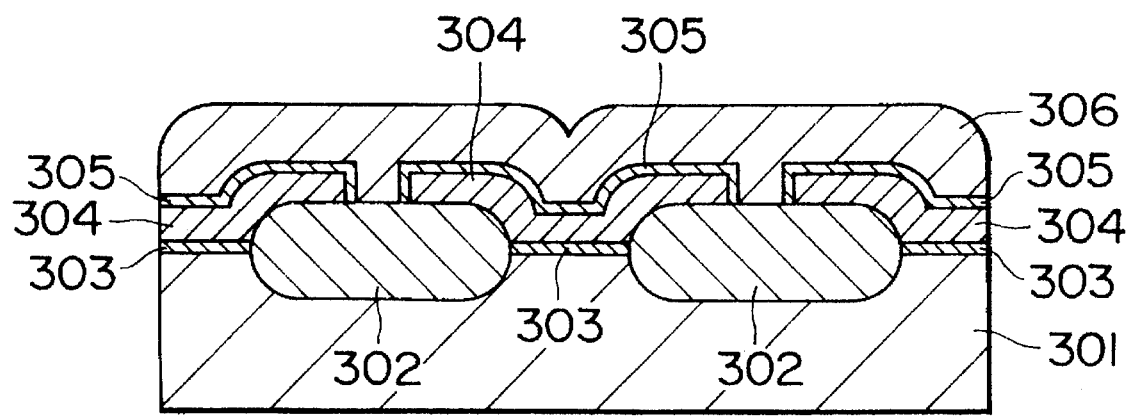
FIG. 9 is a sectional view showing the structure of a conventional non-volatile semiconductor memory device.
Figure 10:
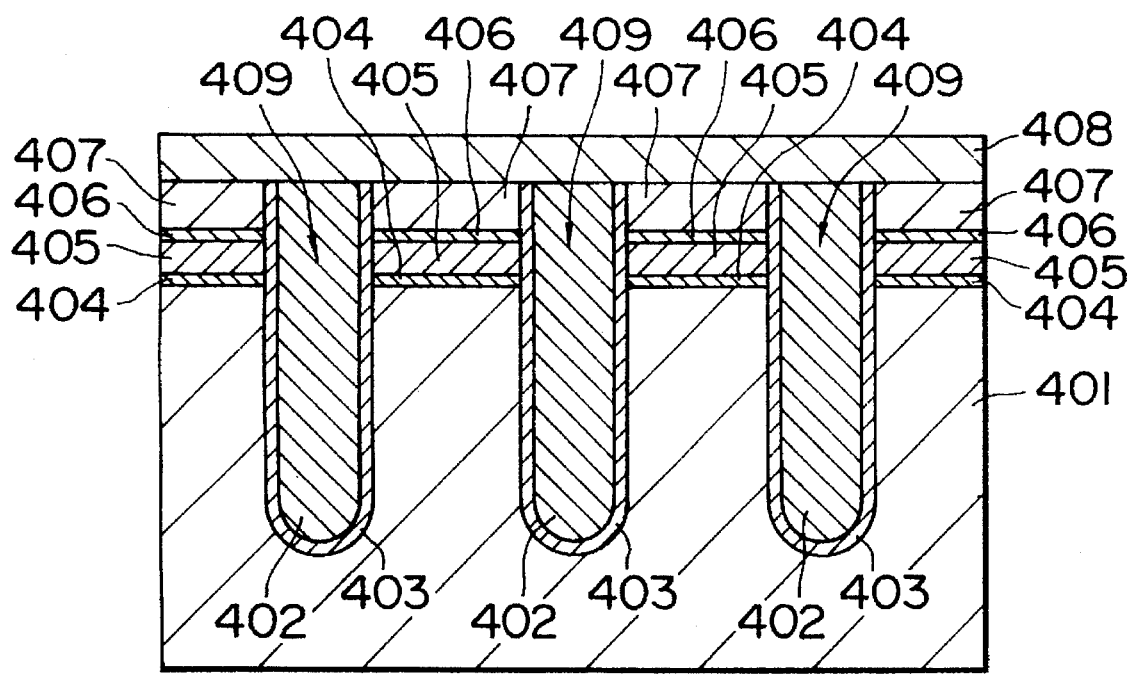
FIG. 10 is a sectional view showing also the structure of a memory cell of a conventional non-volatile semiconductor memory device.

As shown in FIG. 8C, arsenic is implanted into the silicon substrate 201 by slant ion implantation 212 by using the shield gate insulating film 202, the shield electrode 203, the shield cap insulating film 204 and the shield cap nitride film 205 as masks so as to form a buried diffusion layer 206. When arsenic is ion-implanted, ion implantation energy is set to 50 to 90 keV and a dose, to $5 \times 10^{15}$ cm$^{-2}$.

The ion implantation angle θ is given by the following equation:

$$\theta = \tan^{-1}(a/b)$$

where a is the sum (height) of the film thickness of the shield gate insulating film 202, the shield electrode 203, the shield cap insulating film 204 and the shield cap nitride film 205, and b is a distance between two shield electrodes.

For instance, when the shield gate insulating film 202, the shield electrode 203, the shield cap insulating film 204 and the shield cap nitride film 205 are 50 nm, 100 nm, 100 nm and 100 nm-thick, respectively (a=0.35 μm) and the distance b is 1 μm, the implantation angle θ is approximately 20° to 21°. When the shield gate insulating film 202, the shield electrode 203, the shield cap insulating film 204 and the shield cap nitride film 205 are 100 nm, 300 nm, 200 nm and 300 nm-thick, respectively (a=0.9 μm) and the distance b is 1 μm, the implantation angle θ is approximately 42° to 45°.

Because ion implantation 212 is conducted to the substrate 201 from the slanting direction as described above, the shield gate insulating film 202, the shield electrode 203, the shield cap insulating film 204 and the shield cap nitride film 205 serve as the mask, and buried diffusion layers 206 isolated from one another are formed in self-alignment at portions near the end portions of these films. The impurity implanted at this time diffuses somewhat transversely by subsequent heat-treatment, and the buried diffusion layer 206 of a partially overlapping type is formed below the shield gate insulating film 202.

Next, a silicon nitride film having a thickness of about 100 to about 300 nm is deposited on the entire surface and is dry-etched anisotropically to form a sidewall nitride film 207 on the side wall of the shield gate electrode 203, as shown in FIG. 8D. After the surface of the P type silicon substrate 201 of the device regions is exposed by wet etching, an about 10 nm-thick silicon dioxide film is formed as a tunnel oxide film 208 by the thermal oxidation process. In order to prevent polycrystalline silicon constituting the shield electrode 203 from being simultaneously oxidized, the shield cap insulating film 204 and the sidewall nitride film 207 are preferably constituted by a silicon nitride film having oxidation resistance, and either one, or both, of them may be the silicon dioxide film. By the way, it is also possible to use an oxide nitride film obtained by nitriding an oxide film by a quick heat-treatment method, as the tunnel oxide film 208. Thereafter, an electrically conductive polycrystalline silicon film having a film thickness of about 100 to about 300 nm is thereafter formed by the CVD process, and is then isolated on the shield gate electrode 203 in the direction VI—VI in FIG. 5 by photolithography and dry etching so as to form the floating gate electrode 209.

Next, at least a part of the shield cap nitride film 205 is removed by wet etching using hot phosphoric acid as shown in FIG. 8E, and a gap region 205" is defined between the floating gate electrode 209 and the shield cap oxide film 204. Thereafter, for example, an ONO film, which comprises a silicon dioxide film/a silicon nitride film/a silicon dioxide film and has a thickness of about 15 to about 20 nm calculated as the oxide film and which serves as an inter-layer insulating film 210, is formed on the upper and side surfaces of the floating gate electrode 209 and on the lower surface of the floating gate electrode 209 in the gap region 205". The silicon dioxide film as the lower layer of the ONO insulating film is shaped into a film thickness of about 10 nm by the CVD process or the heat oxidation process at 900° to 1,000° C., and the silicon nitride film is shaped into a thickness of about 10 nm by the CVD process. Further, the silicon dioxide film as the upper layer of the ONO insulating film is formed into a thickness of about 5 nm by the CVD process or the heat oxidation process at 900° to 1,000° C.

Next, after an electrically conductive polycrystalline silicon film is formed by the CVD process, etc in such a manner as to cover the surface of the inter-layer insulating film 210, the polycrystalline silicon film is isolated in the direction orthogonal to the direction VI—VI in FIG. 5 by photolithography and dry etching to form a control gate electrode 211. At this time, the floating gate electrode 209 and the inter-layer insulating film 210, too, are etched simultaneously, and the floating gate electrode 209 and the inter-layer insulating film 210, too, are isolated in the direction orthogonal to the direction VI—VI in FIG. 5. Incidentally, the control gate electrode 211 may employ a polyside or silicide structure so as to reduce the sheet resistance.

As described above, the control gate electrode 211 can be formed on the upper surface of the floating gate electrode 209 and at a part of its lower surface by a simple method, and the drain contacts as well as the source contacts can be eliminated by using the source/drain as the buried diffusion layer 206.

The present invention can be applied to fabrication methods of various semiconductor devices having a gate, a source and a drain besides the memory device described above. In such cases, only the formation method of the gate structure may be changed in the fabrication method described above. When, for example, a MOS transistor is fabricated, a gate oxide film is formed on the surface of the silicon substrate 201 and then, a gate wiring comprising a polycrystalline silicon film, etc, may be patterned on the gate oxide film during the fabrication process shown in FIGS. 8D and 8E.

Although the foregoing embodiments deal with the stacked gate type EEPROM having the floating gate 108, 208 by way of example, the present invention can be applied substantially similarly to a MNOS type non-volatile semiconductor memory device to which a high voltage is likewise applied.

According to the present invention as described above, a predetermined voltage is applied to the shield gate electrode formed through the shield gate insulating film so as to effect device isolation, and a part of the region of the control gate electrode is brought into contact with the lower surface of the floating gate electrode through the insulating film. Therefore, the capacitance coupling ratio can be improved without increasing the area of the memory cell, and the reduction of the operating voltage and the higher operating speed of the memory cell can be accomplished.

I claim:

1. A non-volatile semiconductor memory device comprising:
    a semiconductor substrate;
    a shield gate electrode formed over a device isolation region of said semiconductor substrate through a shield gate insulating film;
    a floating gate electrode formed over a device region of said semiconductor substrate through a tunnel insulating film, said device region lying adjacent to said device isolation region and a part of said floating gate electrode overlapping said device isolation region so as to form a gap region therebetween; and
    a control gate electrode formed over said floating gate electrode through an oxide/nitride/oxide (ONO) film and formed over said shield gate electrode through a shield cap insulating film such that a part of said control gate electrode extends into said gap region.

2. A non-volatile semiconductor memory device according to claim 1, wherein said shield cap insulating film includes an ONO film.

3. A non-volatile semiconductor device according to claim 1, wherein said part of said floating gate electrode overlaps said shield gate electrode so as to form said gap region therebetween.

4. A non-volatile semiconductor memory device according to claim 1, wherein two oxide layers of said ONO film have a total thickness of about 15 to about 20 nm.

5. A non-volatile semiconductor memory device according to claim 1, further comprising a sidewall insulating film formed on a side surface of said shield gate electrode.

6. A non-volatile semiconductor memory device according to claim 5, further comprising a buried diffusion layer buried in a surface of said semiconductor substrate.

7. A non-volatile semiconductor memory device according to claim 6, wherein said sidewall insulating film is formed on said buried diffusion layer of said semiconductor substrate.

8. A non-volatile semiconductor memory device according to claim 7, wherein said sidewall insulating film is held between said shield gate insulating film and said tunnel insulating film.

9. A non-volatile semiconductor memory device according to claim 8, wherein said buried diffusion layer is formed under said shield gate insulating film and said tunnel insulating film.

10. A non-volatile semiconductor memory device according to claim 1, wherein said shield gate insulating film has a thickness larger than that of said tunnel insulating film.

11. A non-volatile semiconductor memory device according to claim 10, wherein said shield gate insulating film has a thickness of about 50 to about 100 nm.

12. A non-volatile semiconductor memory device according to claim 10, wherein said tunnel insulating film has a thickness of about 8 to about 20 nm.

13. A non-volatile semiconductor memory device comprising:

device isolation regions respectively including shield gate electrodes formed over a semiconductor substrate of a first conductivity type through a shield gate insulating film and with a predetermined distance between adjacent two of said shield gate electrodes, sidewall insulating films formed on side surfaces of said shield gate electrodes, and cap insulating films formed on a top surface of said shield gate electrodes;

floating gate electrodes formed over device regions through a tunnel insulating film, each of said device regions lying between adjacent two of said device isolation regions and a part of each of said floating gate electrodes extending over each of said adjacent two of said device isolation regions so as to form a gap region therebetween; and control gate electrodes formed in a direction orthogonally crossing said device isolation regions over said floating gate electrodes through an oxide/nitride/oxide (ONO) film and over said shield gate electrodes through a shield cap insulating film such that a part of each of said control gate electrodes extends into said gap region.

14. A non-volatile semiconductor memory device according to claim 13, wherein source/drain diffusion layers of a second conductivity type are disposed on both sides of said device isolation regions in parallel with said device isolation regions.

15. A non-volatile semiconductor memory device comprising:

a device isolation region for electrically isolating adjacent two of device regions formed within a semiconductor region substrate;

a floating gate electrode formed over each of said device regions through a tunnel insulating film, a part of said floating gate electrode overlapping said device isolation region so as to form a gap region therebetween; and a control gate electrode formed at least over said floating gate electrode through an oxide/nitride/oxide (ONO) film such that a part of said control gate electrode extends into said gap region.

16. A non-volatile semiconductor memory device according to claim 15, wherein said device isolation region includes a shield gate electrode formed over said semiconductor substrate through an ONO film.

17. A non-volatile semiconductor memory device according to claim 15, wherein:

said device isolation region includes a shield gate electrode formed over said semiconductor substrate through a shield gate insulating film; and said part of said floating gate electrode extends over said shield gate electrode so as to form said gap region therebetween.

18. A non-volatile semiconductor memory device according to claim 15, wherein two oxide layers of said ONO film have a total thickness of about 15 to about 20 nm.

19. A non-volatile semiconductor memory device according to claim 15, wherein:

said device isolation region includes a shield gate electrode formed over said semiconductor substrate through a shield gate insulating film; and said non-volatile semiconductor memory device further comprises a sidewall insulating film formed on a side surface of said shield gate electrode.

20. A non-volatile semiconductor memory device according to claim 19, further comprising a buried diffusion layer buried in a surface of said semiconductor substrate.

21. A non-volatile semiconductor memory device according to claim 20, wherein said sidewall insulating film is formed on said buried diffusion layer of said semiconductor substrate.

22. A non-volatile semiconductor memory device according to claim 21, wherein said sidewall insulating film is held between said shield gate insulating film and said tunnel insulating film.

23. A non-volatile semiconductor memory device according to claim 22, wherein said buried diffusion layer is formed under said shield gate insulating film and said tunnel insulating film.

24. A non-volatile semiconductor memory device according to claim 15, wherein:

said device isolation region includes a shield gate electrode formed over said semiconductor substrate through a shield gate insulating film; and said shield gate insulating film has a thickness larger than that of said tunnel insulating film.

25. A non-volatile semiconductor memory device according to claim 24, wherein said shield gate insulating film has a thickness of about 50 to about 100 nm.

26. A non-volatile semiconductor memory device according to claim 24, wherein said tunnel insulating film has a thickness of about 8 to about 20 nm.

* * * * *